United States Patent
Kang et al.

(10) Patent No.: US 7,030,489 B2
(45) Date of Patent: Apr. 18, 2006

(54) MULTI-CHIP MODULE HAVING BONDING WIRES AND METHOD OF FABRICATING THE SAME

(75) Inventors: In-Ku Kang, Chungchcongnam-do (KR); Hee-Kook Choi, Chungcheongnam-do (KR); Sang-Ho An, Kyunggi-do (KR); Sang-Yeop Lee, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/632,700

(22) Filed: Jul. 31, 2003

(65) Prior Publication Data

US 2005/0023674 A1    Feb. 3, 2005

(51) Int. Cl.
*H01L 23/34*   (2006.01)

(52) U.S. Cl. ............ 257/723; 257/666; 257/676; 257/692; 257/693; 257/737; 257/777; 438/109

(58) Field of Classification Search ........... 257/666, 257/676, 692, 693, 737, 777; 438/109
See application file for complete search history.

(56) References Cited

U.S. PATENT DOCUMENTS

| | | | |
|---|---|---|---|
| 6,333,562 B1 * | 12/2001 | Lin | 257/777 |
| 6,388,313 B1 | 5/2002 | Lee et al. | |
| 6,552,426 B1 * | 4/2003 | Ishio et al. | 257/692 |
| 6,706,557 B1 * | 3/2004 | Koopmans | 438/109 |
| 2003/0038374 A1 * | 2/2003 | Shim et al. | |

FOREIGN PATENT DOCUMENTS

JP    2001-308262    11/2001

OTHER PUBLICATIONS

English Language of Abstract Japanese Patent Publication No. 2001-308262 published on Nov. 2, 2001.

* cited by examiner

*Primary Examiner*—Mai-Huong Tran
(74) *Attorney, Agent, or Firm*—Marger Johnson & McCollom, P.C.

(57) ABSTRACT

Provided herein are multi-chip modules (MCMs) having bonding wires and fabrication methods thereof. The multi-chip module includes a substrate and a plurality of chips sequentially stacked. At least one top chip, stacked above a lowest chip, has an insulating film that covers the backside thereof. Also, each of the stacked chips has bonding pads formed on the periphery or edges of its upper surface. At least one insulator is interposed between the stacked chips. The insulator exposes the pads on the underlying chip. The pads of the respective chips are connected to a set of interconnections, which are disposed on the substrate. This configuration of stacked chips enables the overall height of the memory module to be reduced because the insulating film prevents the bonding wires from contacting the substrate of the top chips.

20 Claims, 3 Drawing Sheets

MULTI-CHIP MODULE HAVING BONDING WIRES AND METHOD OF FABRICATING THE SAME

BACKGROUND OF THE INVENTION

1. Field of the Invention

The present invention relates to a semiconductor package and a fabrication method thereof and, more particularly, to a multi-chip module having bonding wires and method of fabricating the same.

2. Description of the Related Art

As portable electronic devices become smaller, the dimensions of semiconductor packages in the electronic devices must also be reduced. To help accomplish this, a multi-chip module technique is widely used because it can increase the capacity of the semiconductor package. Multi-chip modules (MCMs) include a plurality of chips, which are stacked.

FIG. 1 is a cross sectional view illustrating a conventional multi-chip module having bonding wires.

Referring to FIG. 1, a bottom chip 3 and a top chip 7 are sequentially stacked on a substrate such as a lead frame or a printed circuit board. The substrate includes a flat body 1 and a first group of interconnections 1a and a second group of interconnections 1b formed on a surface of the body 1. The bottom chip 3 is attached and fixed to the body 1 using an adhesive 5, which is interposed between the bottom chip 3 and the body 1. Spacers 9 are interposed between the top chip 7 and the bottom chip 3 in order to separate the top chip 7 from the bottom chip 3. The bottom chip 3 has a plurality of pads 3a formed on its edges.

The pads 3a are electrically connected to the first group of interconnections 1a through a first group of bonding wires 13. In this case, the first group of bonding wires 13 may be in contact with a backside surface of the top chip 7 if the top chip 7 has the same dimension as the bottom chip 3. Thus, the spacers 9 should have a sufficient height to prevent the first group of bonding wires 13 from being in contact with the backside of the top chip 7. In other words, a distance S between the bottom chip 3 and the top chip 7 should be determined in consideration of the height of the first group of bonding wires 13. Accordingly, there is a limitation in reducing the total thickness of the multi-chip module.

Further, the top chip 7 has a plurality of pads 7a formed on its edges. The pads 7a are electrically connected to the second group of interconnections 1b through a second group of bonding wires 15. The space between the bottom chip 3 and the top chip 7 is filled with an insulator 11.

FIG. 2 is a cross sectional view illustrating another conventional multi-chip module having bonding wires.

Referring to FIG. 2, a bottom chip 23 and a top chip 27 are sequentially stacked on a substrate such as a lead frame or a printed circuit board. The substrate has the same configuration as the substrate described in FIG. 1. That is to say, the substrate includes a flat body 21 and a first group of interconnections 21a and a second group of interconnections 21b formed on a surface of the body 21. Also, the bottom chip 23 is attached and fixed to the body 21 using an adhesive 25, which is interposed between the bottom chip 23 and the body 21. An insulator 29 is interposed between the chips 23 and 27 in order to separate the top chip 27 from the bottom chip 23. The bottom chip 23 has a plurality of pads 23a formed on its edges.

The pads 23a are electrically connected to the first group of interconnections 21a through a first group of bonding wires 31. In this case, the first group of bonding wires 31 may be in contact with a backside surface of the top chip 27 if the top chip 27 has the same dimension as the bottom chip 23. Thus, the insulator 29 should have a sufficient thickness to prevent the first group of bonding wires 31 from being in contact with the backside of the top chip 27. In other words, a distance S between the bottom chip 23 and the top chip 27 should be determined in consideration of the height of the first group of bonding wires 31. Accordingly, there is a limitation in reducing the total thickness of the multi-chip module.

Further, the top chip 27 has a plurality of pads 27a formed on its edges. The pads 27a are electrically connected to the second group of interconnections 21b through a second group of bonding wires 33.

In the meantime, a multi-chip module is taught in U.S. Pat. No. 6,333,562 B1 to Lin, entitled "Multichip module having stacked chip arrangement". In addition, U.S. Pat. No. 6,388,313 B1 discloses a multi-chip module having a bottom chip and a top chip, which are sequentially stacked.

According to the aforementioned conventional MCMs, it is difficult to prevent bonding wires connected to the bottom chip from contacting the backside surface of the top chip. Therefore, it is difficult to realize a thin and reliable package module.

SUMMARY OF THE INVENTION

It is therefore a feature of the present invention to provide thin and reliable multi-chip modules (MCMs) having bonding wires.

It is another feature of the invention to provide methods of fabricating these thin and reliable MCMs having bonding wires.

According to an aspect of the invention, a multi-chip module is provided. The multi-chip module comprises a substrate and a plurality of chips sequentially stacked on the substrate. The substrate includes a plurality of interconnections formed on a top surface thereof. The plurality of chips comprises a lowest chip and at least one top chip. Each of the chips has a plurality of pads formed on the periphery or edges of a front surface thereof. In addition, the top chip stacked above the bottom chip each have an insulating tape, which is attached to its backside. An insulator is interposed between the chips. The insulator preferably has a smaller width than the chips to expose the pads. The pads of the lowest chip are electrically connected to a first group of interconnections on the substrate through a first group of bonding wires. Similarly, the pads of additional chips above the lowest chip are electrically connected to additional groups of interconnections through respective groups of bonding wires.

The top chip may have a greater planar area than a lower chip located under it. Alternatively, all the chips may have substantially the same dimensions, and have their edges aligned.

In an embodiment of the invention, the multi-chip module comprises a substrate with a bottom and top chip sequentially stacked on the substrate. The substrate includes first and second groups of interconnections on a top surface thereof. Each of the chips has pads formed on edges of a front surface thereof. In addition, the top chip includes an insulating tape, which is attached to its backside. An insulator is interposed between the top chip and the bottom chip. The insulator preferably has a smaller width than the chips, thereby leaving the pads of the bottom chip exposed. The pads of the bottom chip are electrically connected to the first group of interconnections through a first group of bonding wires. Similarly, the pads of the top chip are electrically connected to the second group of interconnections through a second group of bonding wires.

The substrate may be a lead frame or a printed circuit board. The top chip can have the same dimension as the bottom chip, or, alternatively, the top chip may have a greater planar area than the bottom chip.

According to another aspect of the invention, a fabrication method of a multi-chip module is provided. The method comprises preparing a substrate and mounting a bottom chip on the substrate. The substrate includes first and second groups of interconnections formed on a top surface thereof. The bottom chip is also mounted on the top surface. The bottom chip pads, which are formed on the edges its front surface, are connected through a first group of bonding wires to the first group of interconnections on the substrate. An insulator is then formed on the upper surface of the bottom chip in a manner to leave the pads on its edges exposed. Next, a top chip is mounted on the insulator. The top chip has an insulating tape attached to its backside. Thus, the insulating film may be in contact with the insulator. The top chip also has pads formed on edges its front surface, which are connected through a second group of bonding wires to the second group of interconnections on the substrate.

Conductive bumps may be additionally formed on the pads of the bottom chip prior to connection with the first group of bonding wires. In this case, the first group of bonding wires are connected to the pads through the bumps and are preferably formed using a bump reverse bonding technique.

BRIEF DESCRIPTION OF THE DRAWINGS

The above and other features and advantages of the present invention will become more apparent to those of ordinary skill in the art by describing embodiments of the present invention in detail with reference to the attached drawings, in which.

DETAILED DESCRIPTION OF THE INVENTION

Figure 1:
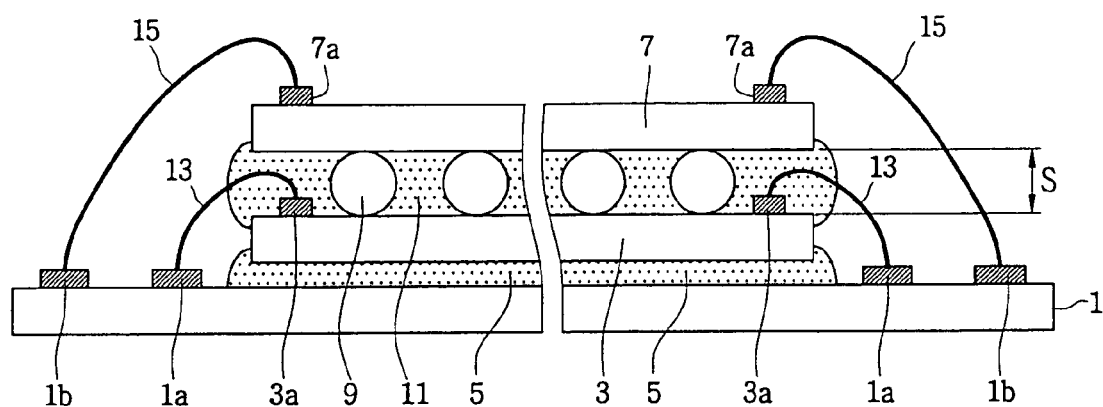
FIG. 1 is a cross-sectional view illustrating a conventional multi-chip module.

The present invention will now be described more fully hereinafter with reference to the accompanying drawings, in which embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
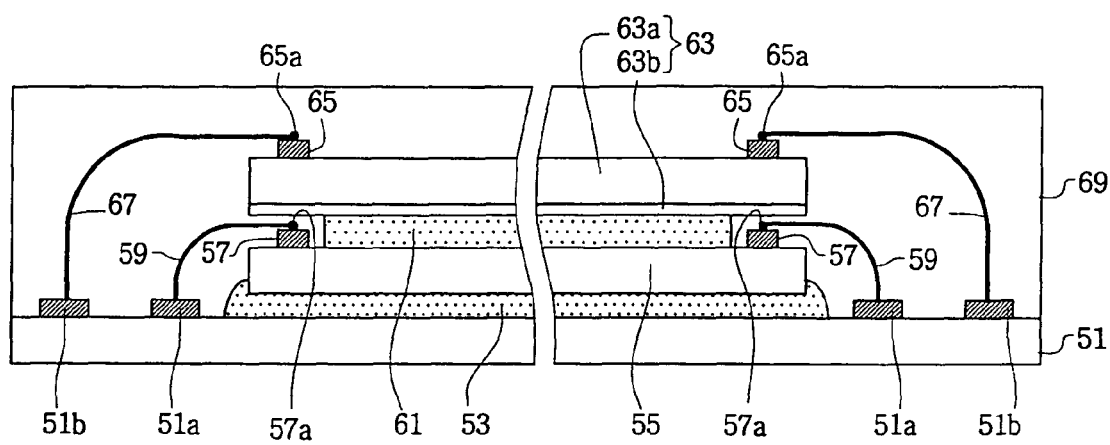
FIG. 3 is a cross-sectional view illustrating a multi-chip module according to an embodiment of the present invention.

FIG. 3 is a cross-sectional view illustrating a multi-chip module according to an embodiment of the present invention.

Referring to FIG. 3, a bottom chip 55 and a top chip 63 are sequentially stacked on a substrate 51. The substrate 51 includes a plurality of interconnections formed on a surface of the substrate 51. The substrate 51 may be, for example, a lead frame or a printed circuit board. The interconnections are composed of a first group of interconnections 51a and a second group of interconnections 51b. The bottom chip 55 has bonding pads 57 formed on the periphery or edges of its front surface. Also, the top chip 63 has bonding pads 65 formed on the edges of its front surface. In particular, the top chip 63 has a chip substrate 63a and an insulating film 63b attached to its backside surface. In addition, the insulating film 63b can cover the backside surface of the chip substrate 63a. The insulating film 63b has a tape-shaped configuration or a sheet-shaped configuration.

An adhesive 53 may be interposed between the bottom chip 55 and the substrate 51. Thus, the bottom chip 55 is fixed to the substrate 51 by the adhesive 53. Also, an insulator 61 is interposed between the bottom chip 55 and the top chip 63. The insulator 61 may have a smaller width than the chips 55 and 63 so that the pads 57 of the bottom chip 55 are exposed. The top chip 63 may have the same dimensions as the bottom chip 55 and fully cover the bottom chip 55, as shown in FIG. 3. Alternatively, the top chip 63 may have a greater planar area than the bottom chip 55. In other words, the top chip 63 may be wider and/or longer than the bottom chip 55.

Figure 2:
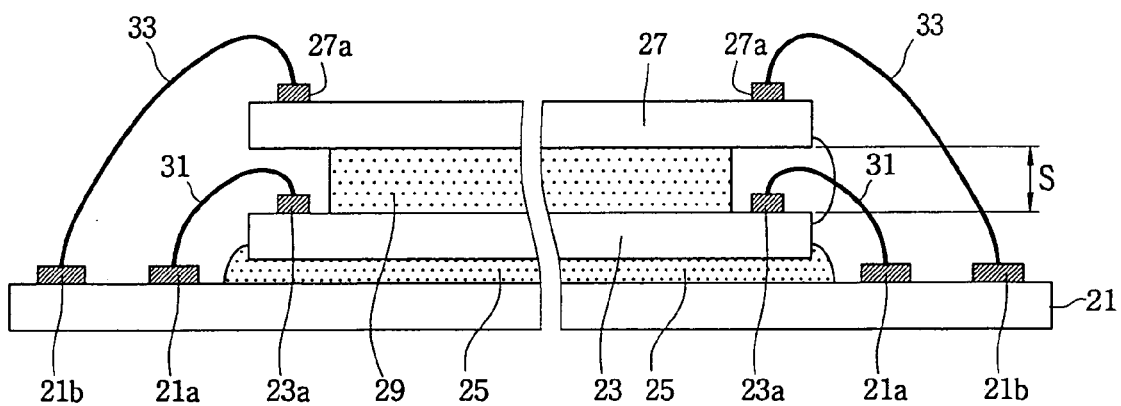
FIG. 2 is a cross-sectional view illustrating another conventional multi-chip module.

The pads 57 of the bottom chip 55 are electrically connected to the first group of interconnections 51a through a first group of bonding wires 59. In this case, the chip substrate 63a of the top chip 63 is not in direct contact with the first group of bonding wires 59 because of the presence of the insulating film 63b, even though the insulator 61 is very thin. Therefore, the total height of the stacked chips 55 and 63 can be reduced as compared to the conventional MCMs shown in FIGS. 1 and 2.

Further, conductive bumps 57a may be additionally formed on the pads 57 of the bottom chip 55. In this case, the first group of bonding wires 59 are electrically connected to the pads 57 through the bumps 57a and are preferably formed using a bump reverse bonding technique, which is well known in the art. If the first group of bonding wires 59 are formed using the bump reverse bonding technique, the height from a top surface of the pads 57 to the highest portion of the bonding wires 59 can be remarkably reduced. This allows the insulator 61 to become thinner without any contact between the bonding wires 59 and the insulating film 63b. Accordingly, reliability of a multi-chip module can be improved.

The pads 65 of the top chip 63 are electrically connected to the second group of interconnections 51b through a second group of bonding wires 67. Bumps 65a may be additionally stacked on the pads 65 of the top chip 63. In this case, the second group of bonding wires 67 are electrically connected to the pads 65 through the bumps 65a. The second group of bonding wires 67 may be formed using the above-mentioned bump reverse bonding technique. The stacked chips 55 and 63 as well as the bonding wires 59 and 67 are sealed with an epoxy molding compound (EMC) 69.

A method of fabricating a multi-chip module according to an embodiment of the present invention will now be described with reference to FIGS. 4 to 6.

Figure 4:
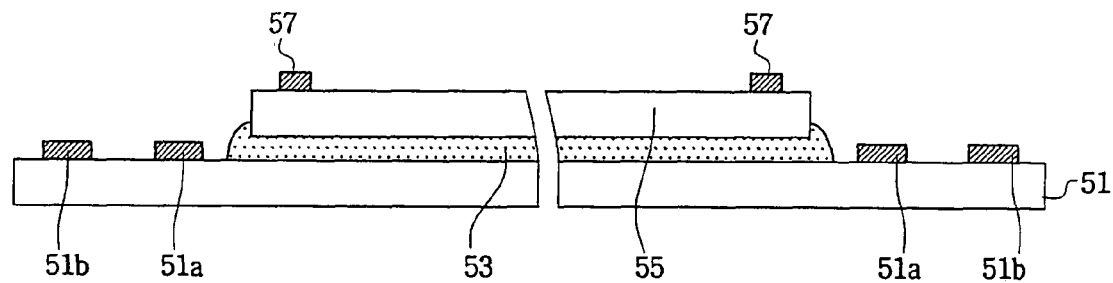
FIGS. 4 to 6 are cross-sectional views for describing a method of fabricating a multi-chip module according to an embodiment of the present invention.

Referring to FIG. 4, a substrate 51 is first provided that has a plurality of interconnections formed on a surface thereof. Also, the interconnections include a first group of interconnections 51a and a second group of interconnections 51b. A bottom chip 55 is mounted on the substrate 51.

Adhesive material 53 may be additionally put on the surface of the substrate 51 before mounting the bottom chip 55 on the substrate 51. Accordingly, the bottom chip 55 can be fixed to the substrate 51 by the adhesive 53. The bottom chip 55 has bonding pads 57 formed on the edges of its front surface (top surface).

Figure 5:
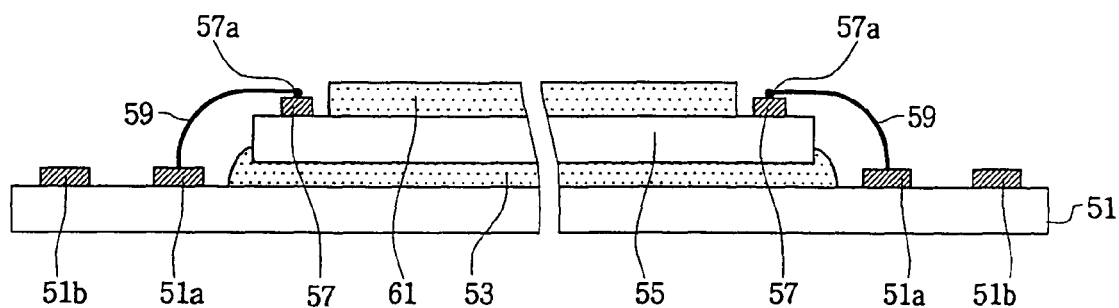

Referring to FIG. 5, a first group of bonding wires 59 are formed to connect the pads 57a to the first group of interconnections 51a. The bonding wires 59 may be formed of gold wires. Conductive bumps 57a may be additionally formed on the pads 57 before forming the first group of bonding wires 59. In this case, the first bonding wires 59 are electrically connected to the pads 57 through the bumps 57a and are preferably formed using a bump reverse bonding technique. If the first group of bonding wires 59 are formed using the bump reverse bonding technique, the distance from a top surface of the pads 57 to the highest portion of the bonding wires 59 can be significantly reduced. An insulator 61 is then formed on the bottom chip 55. Preferably, the insulator 61 has a narrower width than the bottom chip, thereby still exposing or uncovering the pads 57 and the bonding wires 59. In other words, the insulator 61 can be preferably formed to fit on a predetermined region on the bottom chip where it will be surrounded by the pads 57.

Figure 6:
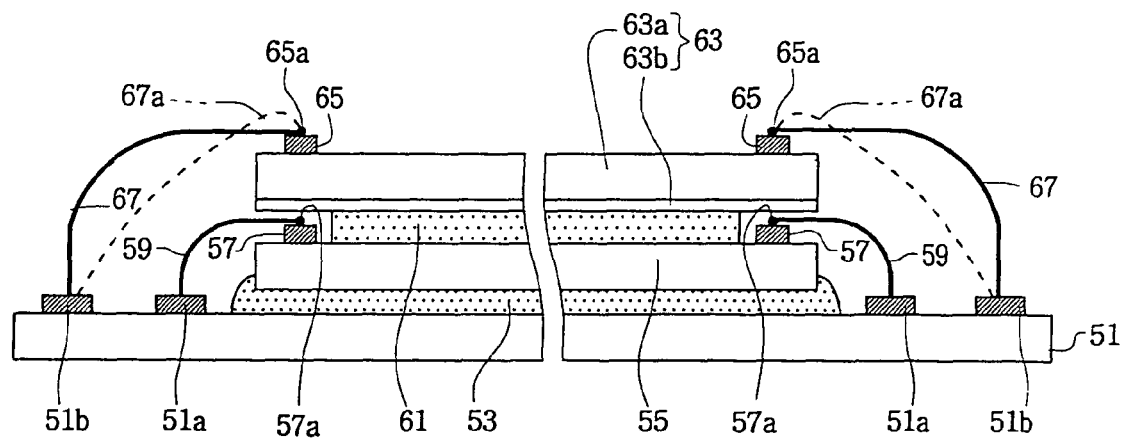

Referring to FIG. 6, a top chip 63 is mounted on the insulator 61. The top chip 63 includes a chip substrate 63a and a thin insulating film 63b attached to its backside surface (bottom surface). Thus, the insulating film 63b can cover the entire backside surface of the chip substrate 63a. Accordingly, the insulating film 63b can be in contact with the insulator 61. The top chip also has bonding pads 65 formed on edges of its front surface (top surface) of the chip substrate 63a.

The top chip 63 may have the same dimensions as the bottom chip 55 and may be mounted to fully cover the bottom chip 55, as shown in FIG. 6. Alternatively, the top chip 63 may have a greater planar area than the bottom chip 55. In other words, the top chip 63 may be wider and/or longer than the bottom chip 55. In any case, the edges of the top chip 63 are located above the ends of the first group of bonding wires 59 where they are connected to the pads 57 of the bottom chip. Even if the bonding wires are touching the top chip 63, the chip substrate 63a is not in direct contact with the bonding wires 59 because of the presence of the insulating film 63b. This results in allowing the thickness of the insulator 61 to be drastically reduced. Accordingly, the total height of the stacked chips 55 and 63 are greatly reduced as compared to the conventional multi-chip module shown in FIGS. 1 and 2.

Further, in the event that the first group of bonding wires 59 are formed using the bump reverse bonding technique as described above, the insulating film 63b can be altogether prevented from being in contact with the bonding wires 59. In other words, the thickness of the insulator 61 can be even further reduced without any contact between the bonding wires 59 and the insulating film 63b. As a result, a highly reliable and thin multi-chip module is realizable.

Subsequently, a second group of bonding wires 67 are formed to connect the pads 65 of the top chip 63 to the second group of interconnections 51b. The second group of bonding wires can be formed using a conventional wire bonding technique (See the dashed line 67a in FIG. 6). Alternatively, bumps 65a may be formed on the pads 65 prior to formation of the second group of bonding wires 67. In this case, the second group of bonding wires 67 (the solid line in FIG. 6) may be formed using the bump reverse bonding technique and electrically connect to the pads 65 through the bumps 65a.

Though not shown in the drawing of FIG. 6, epoxy molding compound (refer to 69 of FIG. 3) is then formed to seal the stacked chips 55 and 63 as well as the bonding wires 59 and 67 (or 67a).

According to the embodiments described above, the thickness of an insulator interposed between stacked chips can be reduced by employing a thin insulating film that covers the backside surface of the chip substrate of the top chip. Therefore, a reliable and thin multi-chip module can be realized.

What is claimed is:

1. A multi-chip module comprising:
   a substrate having a plurality of interconnections formed on a top surface thereof;
   a lowest chip and at least one top chip sequentially stacked on the top surface, the top chip having an insulating tape attached to a backside thereof, the lowest chip and the top chip each having pads formed thereon;
   an insulator interposed between the chips, the insulator exposing the pads; and
   a first group of bonding wires connecting the pads of the lowest chip with a first group of interconnections on the substrate, wherein the bonding pads on the lowest chip are interposed between the lowest chip and the insulating tape, and wherein the insulating tape attached to the backside of the top chip insulates the first group of bonding wires from contacting or connecting to any part of the top chip.

2. The multi-chip module of claim 1, further comprising:
   a second group of bonding wires connecting the pads of the top chip with a second group of interconnections on the substrate.

3. The multi-chip module of claim 1 wherein all the chips have substantially the same dimension and fully cover each other.

4. The multi-chip module of claim 1 wherein the top chip has a greater planar area than the lowest chip located thereunder.

5. The multi-chip module of claim 1 wherein the insulating tape extends the full length of the backside of the top chip.

6. The multi-chip module of claim 5 wherein the insulating tape is substantially thinner than the insulator.

7. The multi-chip module of claim 1 further comprises an epoxy molding compound that encapsulates the stacked chips and the bonding wires.

8. The multi-chip module of claim 1 wherein the lowest chip and the top chip each have peripheral pads formed on a top surface thereof.

9. The multi-chip module of claim 1 wherein the insulator has a smaller width than the chips to expose the pads.

10. A multi-chip module comprising:
    a substrate having a plurality of interconnections formed on a top surface thereof, the interconnections including a first group of interconnections and a second group of interconnections;
    a bottom chip and a top chip sequentially stacked on the top surface, the top chip having an insulating tape attached to its backside and the bottom chip and the top chip each having peripheral pads on a top surface thereof;

an insulator interposed between the bottom chip and the top chip, the insulator having a smaller width than the chips to expose the pads of the bottom chip;

a first group of bonding wires connecting the pads of the bottom chip with the first group of interconnections, wherein the pads on the bottom chip are interposed between the bottom chip and the insulating tape, and wherein the insulating tape attached to the backside of the top chip insulates the first group of bonding wires from contacting or connecting to any part of the top chip; and a second group of bonding wires connecting the pads of the top chip with the second group of interconnections.

11. The multi-chip module of claim 10 wherein the substrate is a lead frame or a printed circuit board.

12. The multi-chip module of claim 11 wherein the top chip has substantially the same dimensions as the bottom chip.

13. The multi-chip module of claim 10 wherein the top chip has a greater planar area than the bottom chip.

14. The multi-chip module of claim 10 further comprises an adhesive interposed between the bottom chip and the substrate.

15. The multi-chip module of claim 12 further comprises conductive bumps formed on the pads of the chips, the bonding wires being in contact with the bumps.

16. The multi-chip module of claim 15 further comprises an epoxy molding compound that encapsulates the bottom chip, the top chip and the bonding wires.

17. A multi-chip module comprising:
a substrate having a plurality of interconnections formed on a top surface thereof;
a lowest chip and at least one top chip sequentially stacked on the top surface, the top chip having an insulating tape attached to a backside thereof, the lowest chip and the top chip each having pads formed thereon, at least one pad being between the lowest chip and the insulating tape;

an insulator interposed between the chips, the insulator exposing the at least one pad; and a first bonding wire connecting the at least one pad with a first interconnection on the substrate, wherein the insulating tape attached to the backside of the top chip insulates the first bonding wire from directly contacting the top chip.

18. A multi-chip module comprising:
a substrate having first and second interconnections on its top surface;
a lower chip and a top chip stacked on the top surface;
bonding pads on the top surface of each of the lower chip and the top chip;
a first group of bonding wires connecting the first interconnections of the substrate with the bonding pads of the lower chip;
a second group of bonding wires connecting the second interconnections of the substrate with the bonding pads of the top chip;
an insulating tape attached to a side of the top chip that is facing the bonding pads on the top surface of the lower chip; and
an insulator, distinct from the insulating tape, interposed between the insulating tape and the lower chip, wherein the insulator exposes the bonding pads,
wherein the bonding pads on the lower chip are interposed between the lower chip and the insulating tape.

19. The multi-chip module of claim 18 wherein the insulating tape extends the full length of the top chip.

20. The multi-chip module of claim 19 wherein the insulating tape is substantially thinner than the insulator.

* * * * *